United States Patent
Shim et al.

(10) Patent No.: US 11,670,521 B2
(45) Date of Patent: Jun. 6, 2023

(54) RELIABLE SEMICONDUCTOR PACKAGES FOR SENSOR CHIPS

(71) Applicant: UTAC Headquarters Pte. Ltd., Singapore (SG)

(72) Inventors: Il Kwon Shim, Singapore (SG); Jeffrey Punzalan, Singapore (SG)

(73) Assignee: UTAC Headquarters Pte. Ltd, Singapore (SG)

( * ) Notice: Subject to any disclaimer, the term of this patent is extended or adjusted under 35 U.S.C. 154(b) by 0 days.

(21) Appl. No.: 17/125,995

(22) Filed: Dec. 17, 2020

(65) Prior Publication Data

US 2021/0193483 A1    Jun. 24, 2021

Related U.S. Application Data

(60) Provisional application No. 62/950,128, filed on Dec. 19, 2019.

(51) Int. Cl.
*H01L 23/00*     (2006.01)
*H01L 21/56*    (2006.01)
*H01L 23/31*    (2006.01)
*H01L 21/60*    (2006.01)

(52) U.S. Cl.
CPC ............ *H01L 21/561* (2013.01); *H01L 23/31* (2013.01); *H01L 24/14* (2013.01); *H01L 24/94* (2013.01); *H01L 2021/60097* (2013.01)

(58) Field of Classification Search
CPC ....... H01L 21/561; H01L 23/31; H01L 24/14; H01L 24/94; H01L 2021/60097
USPC .......................................... 257/737; 438/613
See application file for complete search history.

(56) References Cited

U.S. PATENT DOCUMENTS

| | | | | |
|---|---|---|---|---|
| 2005/0151268 | A1* | 7/2005 | Boyd | H01L 24/13 257/784 |
| 2008/0164595 | A1* | 7/2008 | Wu | H01L 24/73 257/686 |
| 2009/0046183 | A1* | 2/2009 | Nishida | H01L 27/14618 348/294 |
| 2015/0279803 | A1* | 10/2015 | van Gemert | B81B 7/0048 257/737 |
| 2016/0148879 | A1* | 5/2016 | Saxod | H01L 23/3121 438/118 |
| 2018/0182801 | A1* | 6/2018 | Tan | H01L 27/14634 |

* cited by examiner

*Primary Examiner* — Didarul A Mazumder
(74) *Attorney, Agent, or Firm* — Horizon IP Pte Ltd.

(57) ABSTRACT

A method for forming a semiconductor package is disclosed. The method includes providing a package substrate having a die attach region with a die attached thereto. A protective cover is disposed over a sensor region of the die and attached to the die by a cover adhesive. The protective cover is supported by a standoff structure disposed on the die and below the protective cover. An encapsulant is disposed to cover the package substrate while leaving the top package surface exposed.

14 Claims, 25 Drawing Sheets

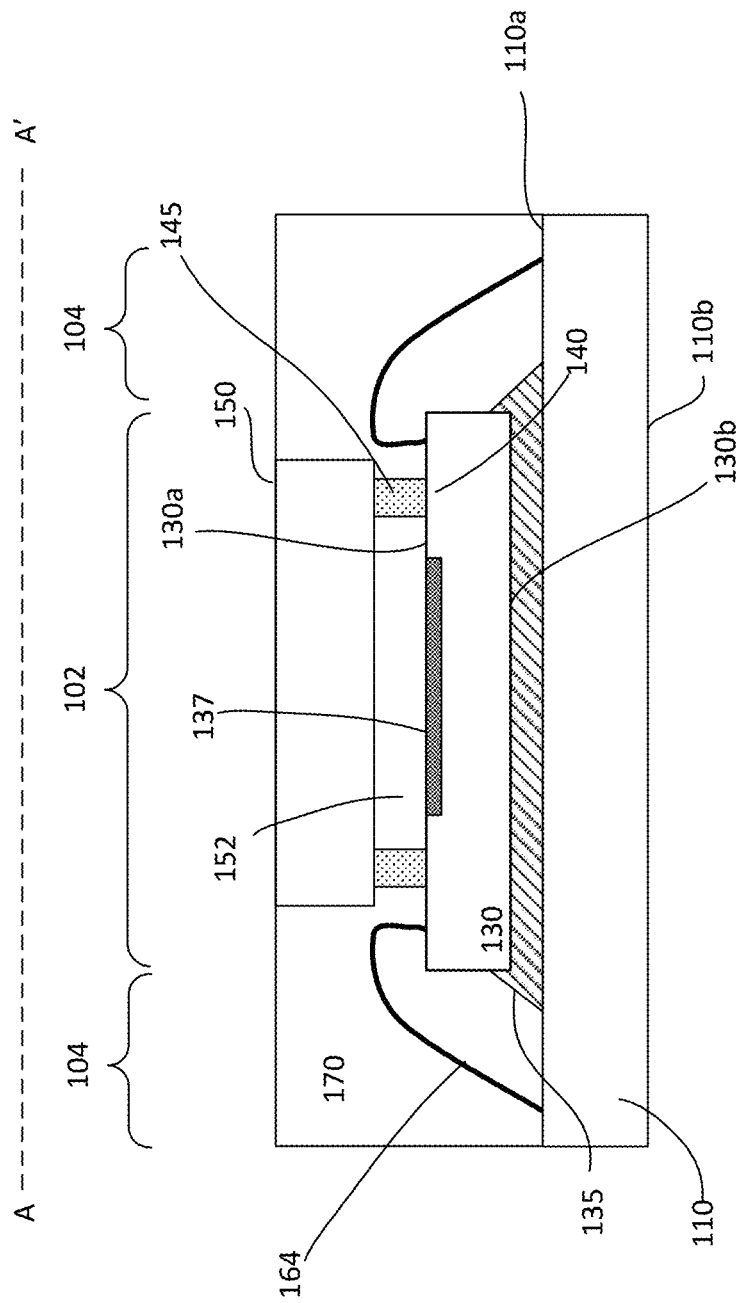

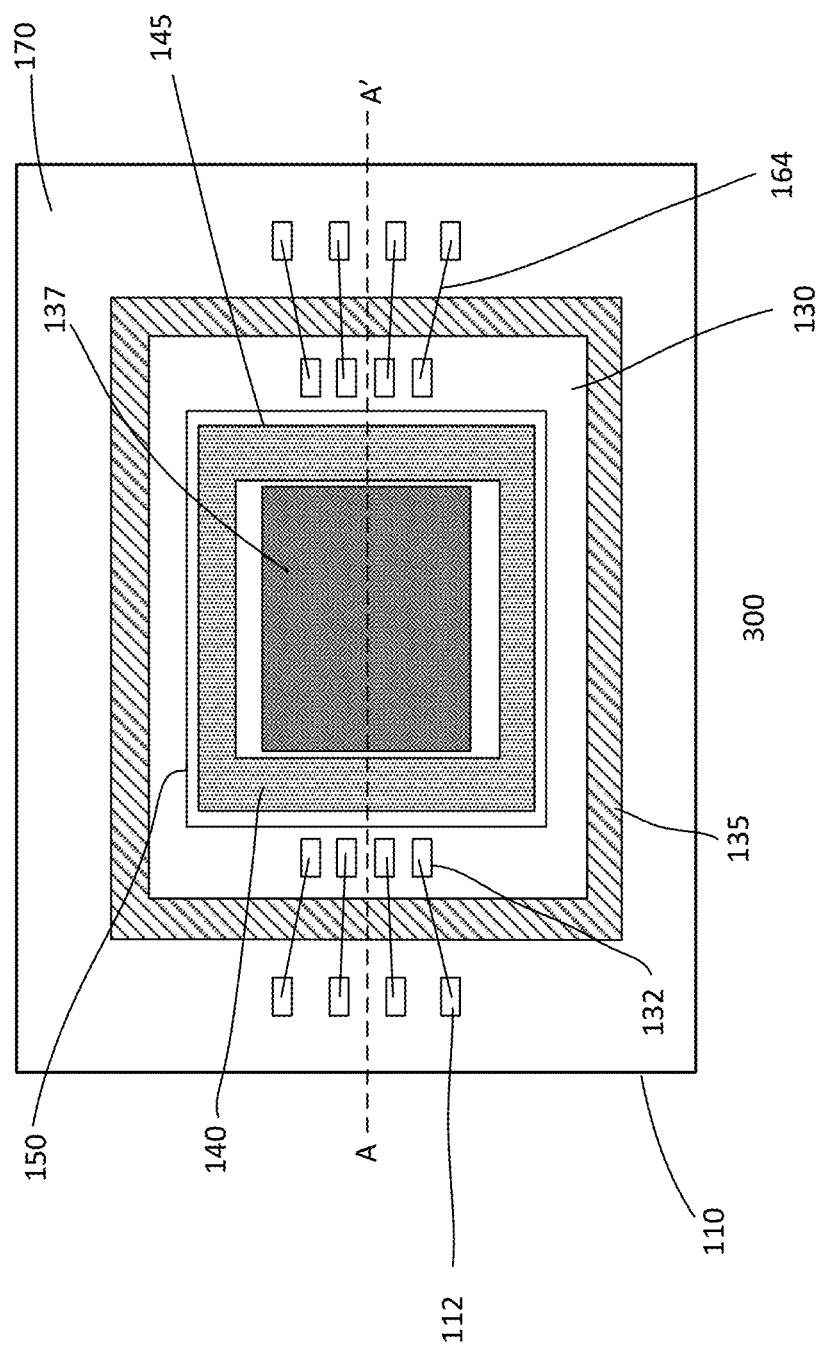

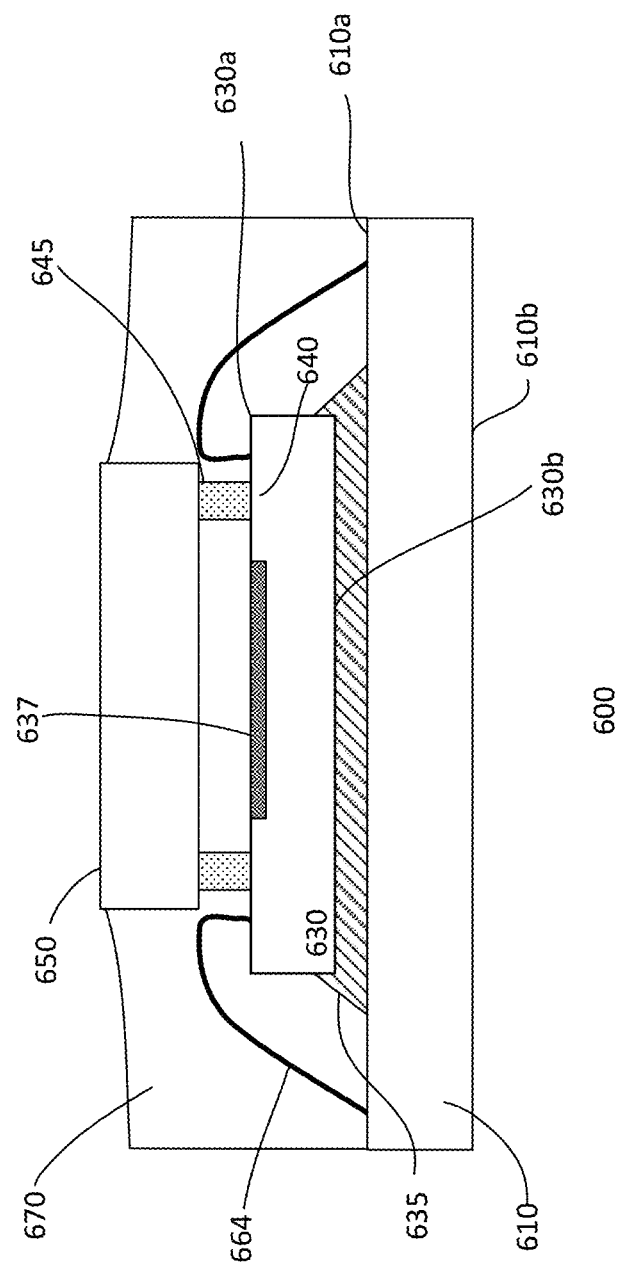

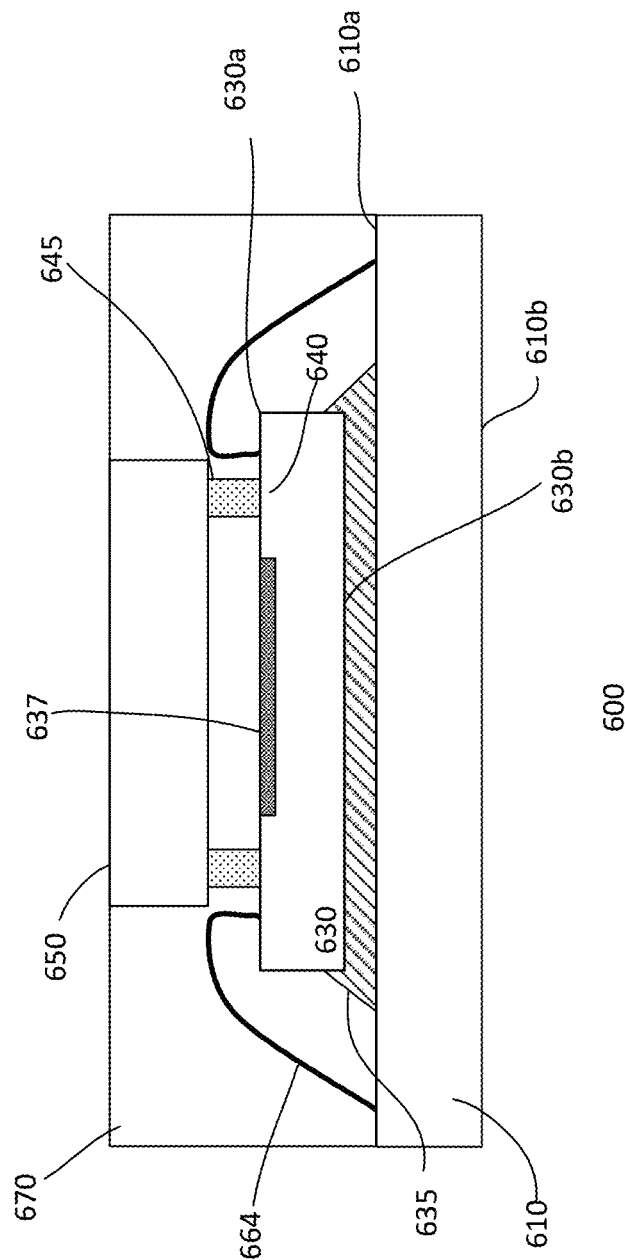
Fig. 6e ii

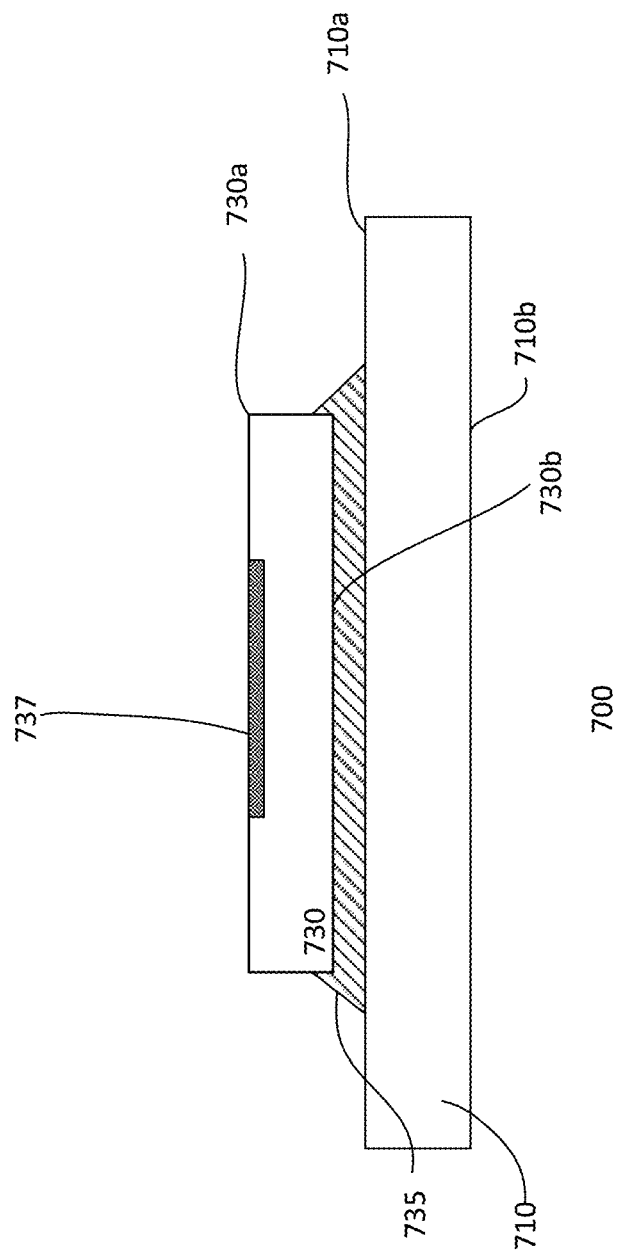

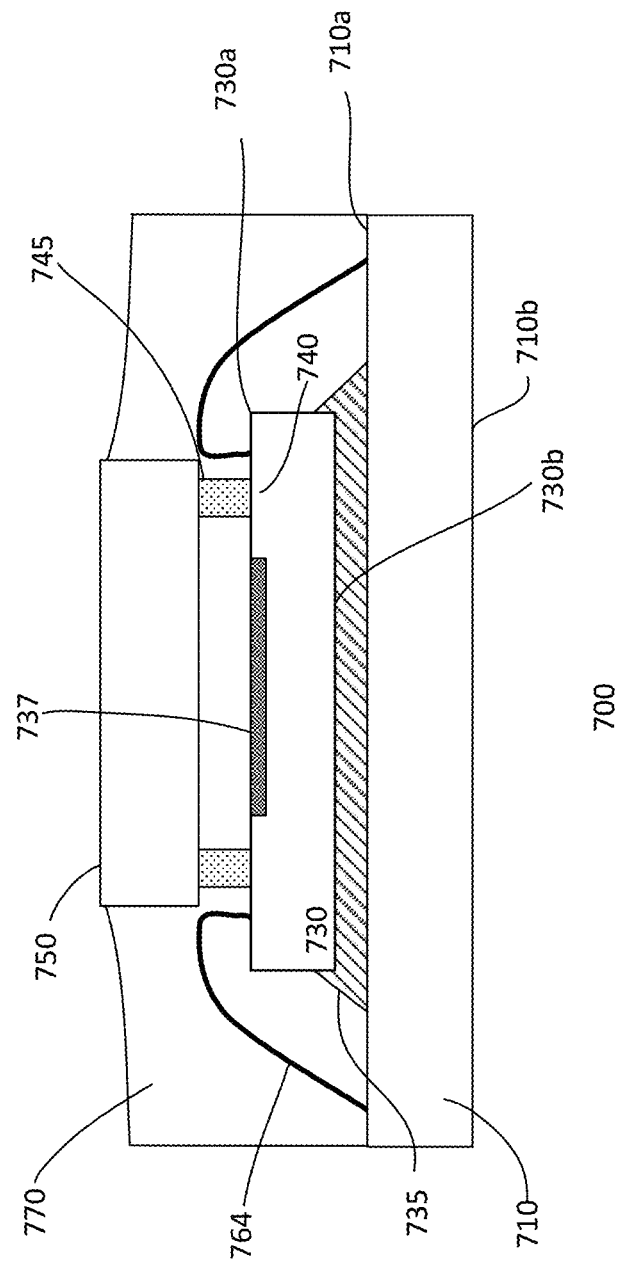
Fig. 7e$_i$

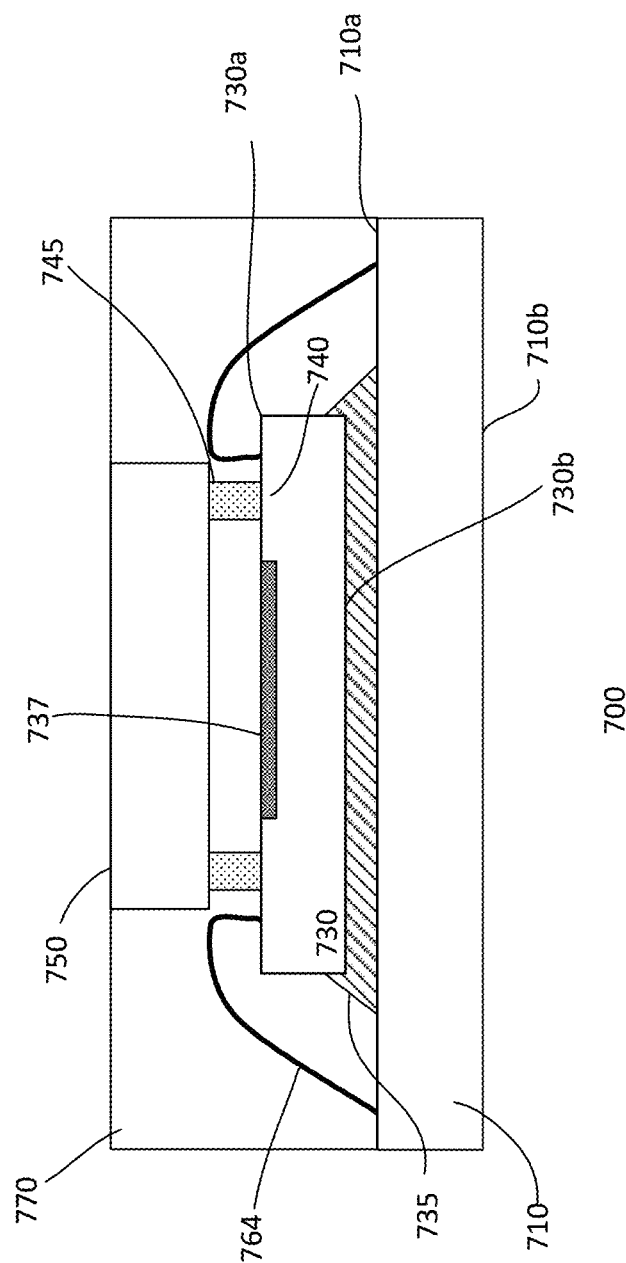
Fig. 7e_ii

RELIABLE SEMICONDUCTOR PACKAGES FOR SENSOR CHIPS

CROSS-REFERENCE TO RELATED APPLICATION

This application claims the benefit of U.S. Provisional Application No. 62/950,128, filed on Dec. 19, 2019, which is incorporated herein by reference in its entirety for all purposes.

FIELD OF THE INVENTION

The present disclosure relates to semiconductor packages and the manufacturing method of such packages. In particular, the present disclosure relates to semiconductor packages for sensor chips. More specifically, the present disclosure relates to semiconductor packages for image sensor chips.

BACKGROUND

Sensing devices generally include sensor chips used for receiving non-electrical signals from the surrounding environment. A sensor chip converts the non-electrical signals received into electrical signals that are transmitted to a printed circuit board. For example, an image sensor chip converts incoming light into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a transparent cover is provided over the sensor area of the image sensor die. For example, the transparent cover forms a cavity over the sensor area. The cover permits light to reach the optically active area of the die while also providing protection for the die from the environment. An encapsulant is provided over the die and on the side edges of the transparent cover.

An adhesive is typically employed to attach the cover to the die. The height of the cavity between the cover and sensor surface depends on the adhesive. However, conventional packages may result in uneven or non-uniform cavity height. Non-uniformity or unevenness in cavity height may be caused by, for example, uneven adhesive flow. Non-uniformity or unevenness in cavity height may cause potential reliability issues, such as, for example, damage to wire bonds due to insufficient cavity clearance.

From the foregoing discussion, there is a desire to provide a reliable sensor package.

SUMMARY

Embodiments generally relate to semiconductor packages and methods for forming semiconductor packages.

In one embodiment, a method for forming a semiconductor package includes providing a package substrate having top and bottom major package substrate surfaces and the top major package surface includes a die attach region. The method also includes attaching a second major die surface of a die onto the die attach region. A first major die surface of the die includes a sensor region and a cap bond region surrounding the sensor region. The method further includes forming a standoff structure on the cap bond region, and attaching a protective cover on the standoff structure. The protective cover forms a cavity over the sensor region, and the standoff structure is configured to maintain a height of the cavity (cavity height) between the protective cover and the first major die surface of the die at a predefined height.

In another embodiment, a device includes a package substrate having top and bottom major package substrate surfaces and the top major package surface includes a die attach region. The device also includes a die having a second major die surface attached to the die attach region. A first major die surface of the die includes a sensor region and a cap bond region surrounding the sensor region. The device further includes a standoff structure on the cap bond region, and a protective cover attached to the standoff structure. The protective cover forms a cavity over the sensor region, and the standoff structure is configured to maintain a height of the cavity (cavity height) between the protective cover and the first major die surface of the die at a predefined height.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a to 1c show top and side cross-sectional views of various embodiments of a semiconductor package;

FIGS. 3a to 3c show top and side cross-sectional views of various embodiments of another semiconductor package;

DETAILED DESCRIPTION

Embodiments described herein generally relate to semiconductor packages and methods for forming a semiconductor package. In some embodiments, the semiconductor package includes a sensor chip used for sensing environmental signals, such as optical signals, audio signals, or the like. The semiconductor package includes a cover over the sensor chip. The semiconductor package may include other types of chips with a cover thereover. The semiconductor package may be incorporated into electronic devices or equipment, such as sensing devices, navigation devices, telecommunication devices, computers and smart devices.

Figure 1A:
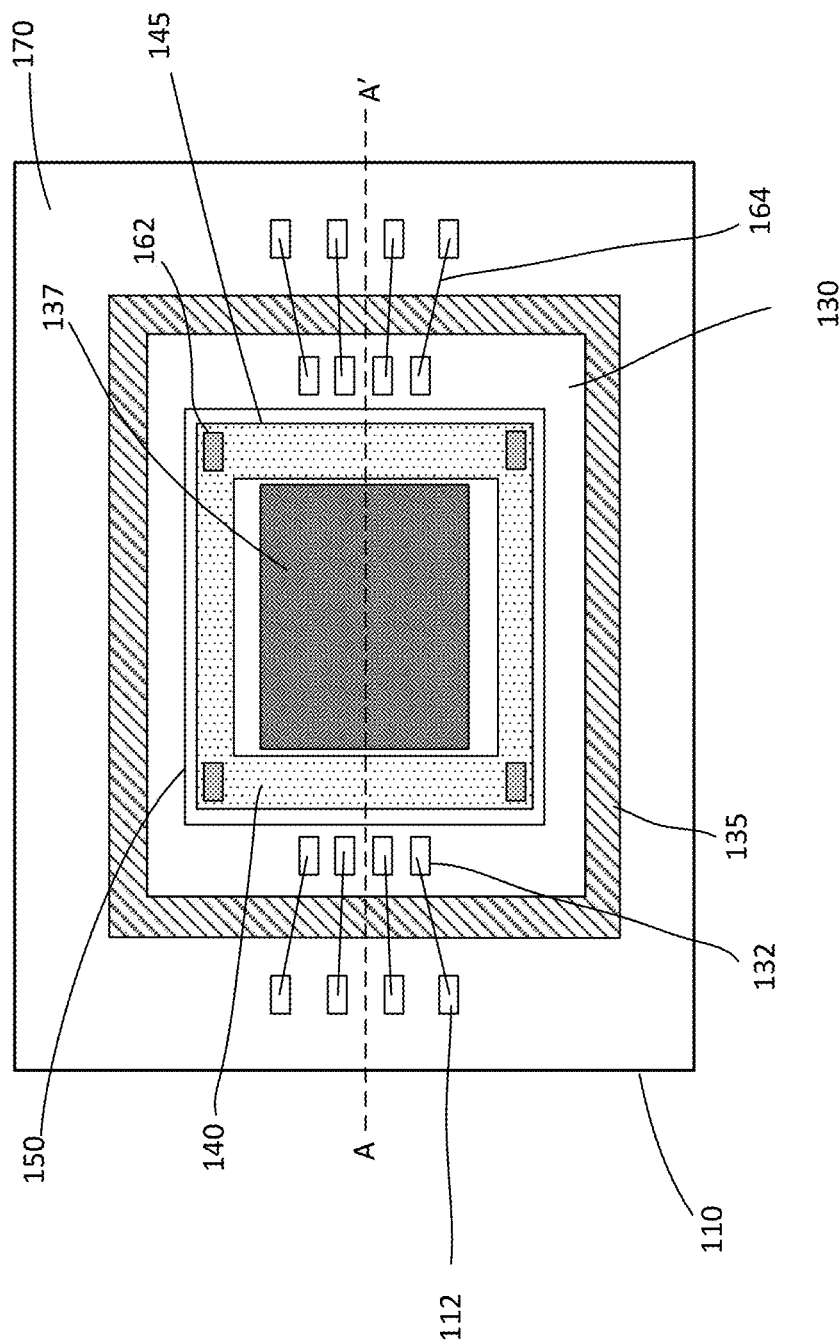
Figure 1B:
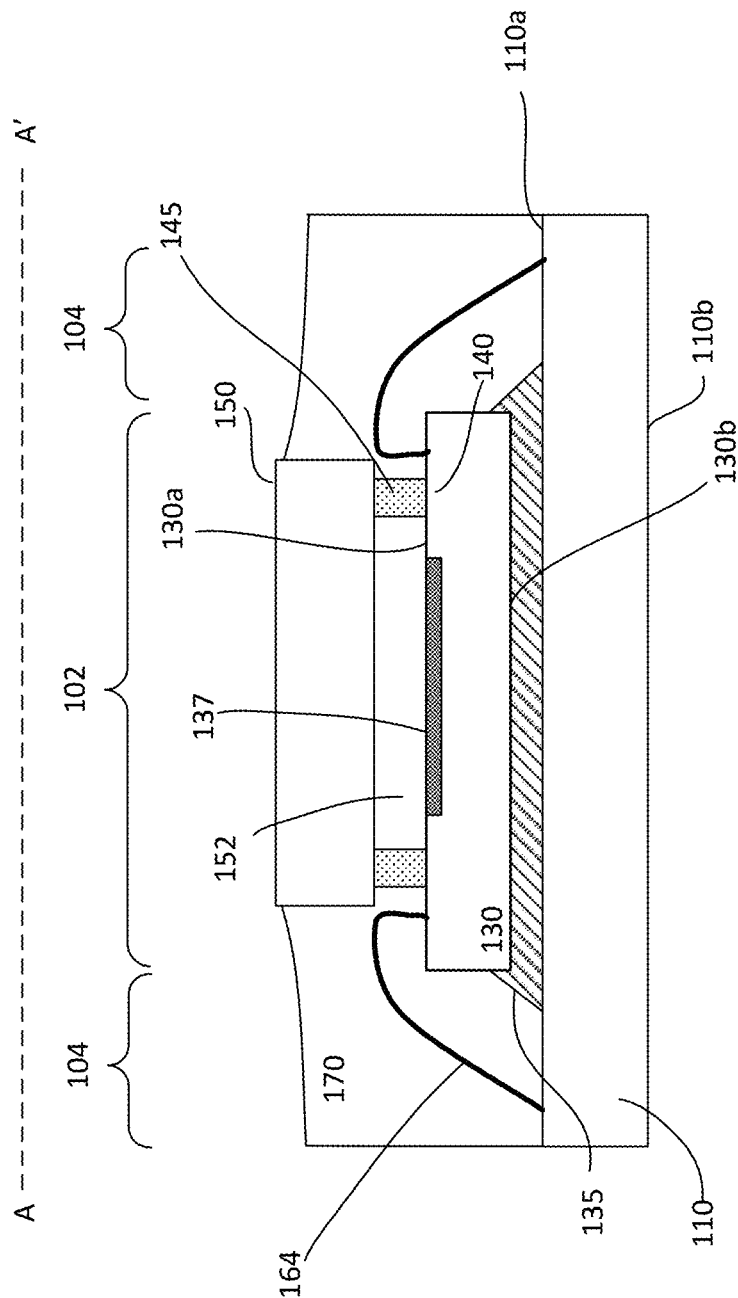

FIGS. 1a to 1c show top and side cross-sectional views of various embodiments of a semiconductor package 100. In particular, FIG. 1a shows a top cross-sectional view of a semiconductor package 100 with a protective cover, and FIGS. 1b to 1c show cross-sectional views taken along the A-A of the semiconductor package 100 packaged in different encapsulants. The various embodiments include common elements. Common elements may not be described or described in detail.

The semiconductor package 100 includes a package substrate 110 having opposing first and second major surfaces 110a and 110b. The first major surface 110a may be referred to as the top or active package surface and the second major surface 110b may be referred to as the bottom package surface. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrate, including ceramic and leadframe substrates, may also be useful. It is understood that the package substrate 110 may have various configurations, depending on design requirements.

The top package surface of the package substrate may be defined with die and non-die regions 102 and 104. The non-die region 104, for example, surrounds the die region 102. For example, the die region may be centrally disposed within the top package surface of the package substrate with the non-die region surrounding it. Providing a die region which is not centrally disposed within the top package surface may also be useful. The die region includes a die attach region for a die to be mounted thereto.

The top package surface of the package substrate may include package bond pads. In some embodiments, the top package surface of the package substrate includes package bond pads 112 disposed in the non-die region 104. For example, the package bond pads are disposed outside of the die attach region. The bottom package surface may include package contacts. The package contacts, for example, are electrically coupled to the package bond pads of the top package surface of the package substrate. For example, each package contact is coupled to its respective package bond pad. The package substrate may include one or more conductive layers embedded therein. The conductive layers may form interconnect structures including conductive traces and contacts for interconnecting the package contacts to package bond pads.

A die 130 is attached to the die attach region of the top package surface of the package substrate. The die, for example, includes first and second opposing major die surfaces 130a and 130b. The first major die surface may be referred to as a top or active die surface and the second major die surface may be referred to as a bottom or inactive die surface.

The die 130, as shown, is attached to the die attach region of the package substrate by a die adhesive 135. The adhesive may be a curable glue or adhesive tape. For example, a curing process may be performed to permanently attach the die to the die region. Other types of die adhesives may also be useful to attach the die to the die region. The bottom die surface 130b of the die, for example, contacts the die attach region. For example, the inactive die surface contacts the die attach region of the package substrate.

In one embodiment, the active die surface 130a includes a sensor region 137. For example, the die is a sensor chip. Other types of dies may also be useful. For example, the die may be a thermal or infrared (IR) image sensor chip. Other types of chips, for example, non-sensor chips, may also be useful. In the case of an image sensor chip, the sensor region may include a photosensitive sensor that may capture image information in response to light. The image sensor may be, for example, a CMOS or CCD type image sensor. In one embodiment, the sensor region includes an array of sensors. For example, each sensor may correspond to a pixel of an image. The sensor chip may include CMOS components embedded in the chip for controlling the sensor chip. Other configurations of the sensor chips may also be useful.

The active die surface 130a may include die bond pads 132 disposed outside of the sensor region. For example, the die bond pads may be disposed on the non-sensor region of the active surface of the die. The die bond pads are exposed by openings formed in a top passivation layer of the die. The surfaces of the die bond pads, for example, are substantially coplanar with the active surface of the die. Providing die bond pads with surfaces which are not coplanar with the active die surface may also be useful. The die bond pads provide external electrical connections to various components of the die. A conductive material, such as copper (Cu), aluminum (Al), Gold (Au), Silver (Ag), Nickel (Ni), solder material, or the alloys of these materials, or a combination thereof, may be used to form the die bonds pads. Other types of conductive material may also be useful. As shown, the die bond pads may be arranged into one or more rows disposed along the periphery of the active surface of the die. Other arrangements of the die bond pads may also be useful.

In one embodiment, a plurality of wire bonds 164 are provided to electrically connect the die bond pads 132 on the active surface of the die to the package bond pads 112 on the top package surface of the package substrate. The wire bonds enable external connection to the internal circuitry of the die. The wire bonds, for example, may be formed of any suitable metal material such as, but not limited to, Cu, Au, Ag, Al, or the alloys of these materials, or a combination thereof. Other types of conductive materials may also be used. The wire bonds 164 create electrical connection between the interconnect structures (e.g., bond pads, conductive traces, via contacts, terminal pads) of the package substrate 110 and the semiconductor die 130.

A protective cover or cap 150 is disposed on the active surface of the die 130 over the sensor region 137. The protective cover includes first or top and second or bottom opposing cover surfaces with sides or edges. The bottom cover surface, for example, is facing the die. The protective cover, for example, may be a glass cover which enables light to penetrate to the sensor region. Other types of protective covers may also be useful. For example, the protective cover may depend on the type of sensor. The protective cover is configured to cover the sensor region to protect the sensor region. For example, the protective cover serves as a cap over the sensor region. As shown, the protective cover has a rectangular shape. Providing a protective cover with other shapes may also be useful.

In one embodiment, the active die surface includes a cap bond region 140. The cap bond region 140, as shown, surrounds the sensor region 137. The cap bond region, in one embodiment, includes a standoff structure 145. For example, the standoff structure is disposed on the cap bond region on the active die surface surrounding the sensor region. As shown, the standoff structure completely surrounds the sensor region. For example, the standoff structure is a standoff ring which surrounds the sensor region.

The standoff structure, in one embodiment, is an adhesive-based standoff ring configured for attaching the protective cover over the sensor region. For example, the standoff ring includes an adhesive for attaching the protective cover to the die. The adhesive may be a curable adhesive. In one embodiment, the curable adhesive has a high transparency and high refractive index. For example, such curable adhesives include epoxy, acrylic, polyimide, urethane, thiol, or a combination thereof. Other suitable adhesive materials may also be useful, depending on the desired refractive index of the protective cover. A curing process may be performed to permanently attach the protective cover to the die. The curing process, for example, may be performed to permanently attach the die to the die attach region of the package substrate and the protective cover to the die.

When attached, the protective cover forms a cavity 152 over the sensor region. For example, the protective cover seals the sensor region. The protective cover, together with the standoff structure, prevents contaminants, such as encapsulation material, from affecting the sensor region. The cavity may be an air cavity. In one embodiment, the standoff structure is configured with a predefined or predetermined height. This facilitates the standoff structure in maintaining the height of the cavity 152 (cavity height) between the sensor region and the protective cover at the predetermined height. The predetermined height, for example, should be sufficient to ensure that the protective cover does not contact either the wire bonds or the sensor region during the packaging process. For example, the predetermined height may be about 100 to 120 microns. In one embodiment, depending on the configuration of the die, the predetermined height may be different. For example, a predetermined height is set based on dimensions of an active die area. The predetermined height may also be determined based on a wire loop height of the wire bonds formed on the die. For example, for a die with a low wire loop design (low wire loop height), the predetermined height is about 80 to 100 microns. Other predetermined heights for the standoff structure or cavity may also be useful.

In one embodiment, the standoff structure includes rigid studs 162 in the cap bond region. The rigid studs, in one embodiment, are metallic studs. For example, the rigid studs may be formed of Cu, Au, Ag, Al, solder, or alloys thereof. Other types of rigid materials may also be useful. As shown, the rigid studs include 4 rigid studs disposed at corners of the cap bond region. As shown, the rigid studs are rectangular. Other shapes for the rigid studs may also be useful. In one embodiment, the rigid studs are formed on dummy bond pads. Dummy bond pads are similar to die bond pads but are not used for electrical connections. The rigid studs may be formed by, for example, bumping. Other techniques for forming the studs may also be useful. The rigid studs are formed with a predetermined stud height to define the height of the cavity. For example, the predetermined stud height corresponds to the predetermined height of the standoff structure. Additionally, the rigid studs ensure an overall height uniformity of the standoff structure. For example, the rigid studs distributed in the cap bond region serve to maintain the cavity height at about the predetermined height. Providing other numbers or configurations of studs or at other locations may also be useful. The adhesive is disposed on the cap bond region, covering the rigid studs.

As shown, the die bond pads 132 are disposed on the active surface of the die outside of the cap bond region 140. As such, the wire bonds 164 are disposed completely outside of the cap bond region. Other configurations of die bond pads and wire bonds may also be useful. For example, the die bond pads may be disposed on the cap bond region or a combination of cap bond region and outside of the cap bond region.

An encapsulant 170 is disposed on the package substrate. The encapsulant 170 covers the package substrate, exposed portions of the die and sides of the protective cover 150. For example, the encapsulant is configured to adhere to the sides of the cover while leaving the top of the cover exposed. For example, the encapsulant 170 extends into the non-die region 104 of the semiconductor package 100 to cover the exposed top surface of the package bond pads in the top package surface 110a. The encapsulant may be formed using ceramic, plastic, epoxy, or a combination thereof. Providing other materials to form the encapsulant may also be useful. The standoff structure may serve as a stopper to prevent encapsulant material from leaking into the sensor region during the encapsulation process while maintaining the cavity height at the predetermined height. As a result, the reliability of the package is increased.

In one embodiment, as shown in FIG. 1b, the topmost surface of the encapsulant 170 may be formed slightly below the top surface of the protective cover 150 and slopes downwardly from the protective cover towards a perimeter of the non-die region 104. For example, a liquid encapsulant is used. Alternatively, as shown in FIG. 1c, the encapsulant 170 may be formed with vertical sidewalls and a substantially planar top surface that is about level with the top surface of the protective cover 150. For example, the encapsulant is a solid mold compound. The encapsulant provides a rigid and mechanically strong structure to protect the sensor region from the environment. For example, the encapsulant protects the sensor region from moisture and provides the protective cover with mechanical support.

Figure 2A:
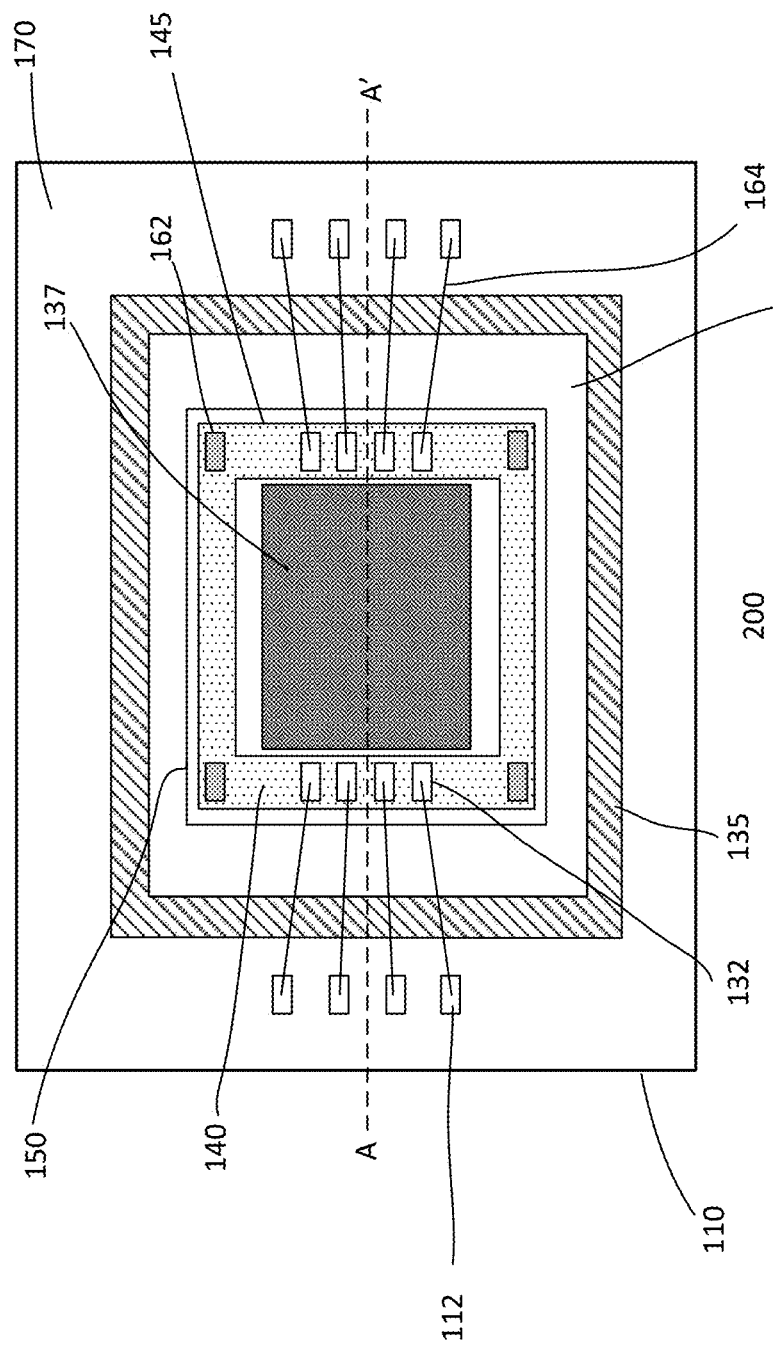
FIGS. 2a to 2c show top and side cross-sectional views of various embodiments of another semiconductor package.
Figure 2B:
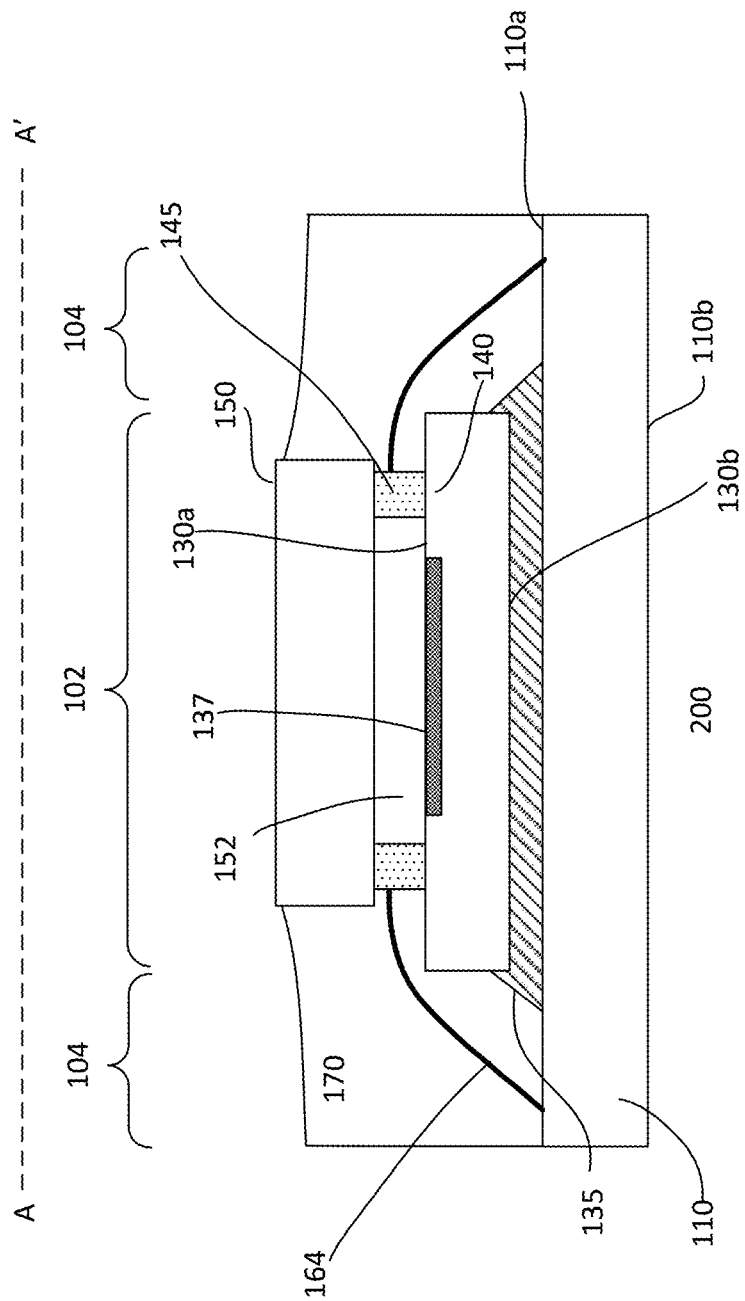
Figure 2C:
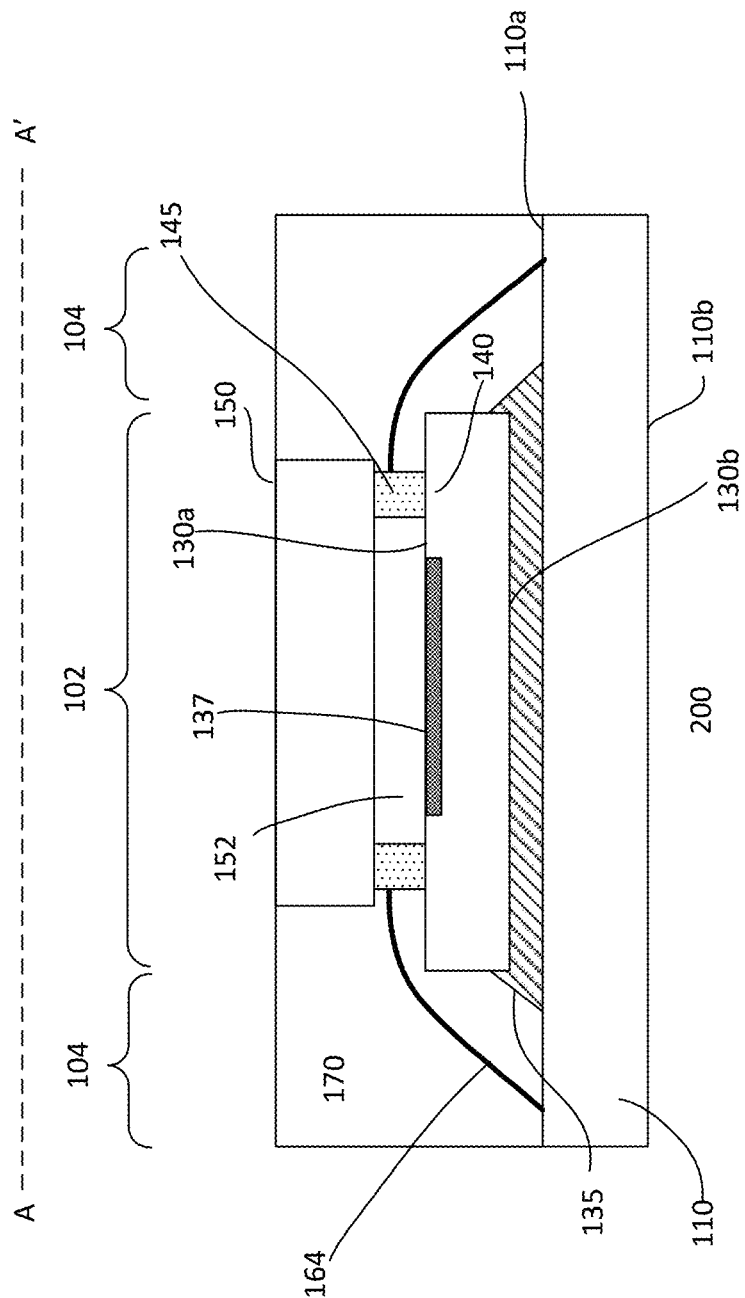

FIGS. 2a to 2c show top and side cross-sectional views of various embodiments of a semiconductor package 200. In particular, FIG. 2a shows a top cross-sectional view of a semiconductor package 200 with the package cover, and FIGS. 2b to 2c show side cross-sectional views taken along the A-A of the semiconductor package 200 formed with different encapsulants. The various embodiments include common elements. Common elements may not be described or described in detail.

The package 200 is similar to that described in FIGS. 1a to 1c. However, unlike FIGS. 1a to 1c, the die bond pads 132 are disposed on the cap bond region 140. In such cases, portions of the wire bonds are covered by the protective cover. For example, when the adhesive is applied on the cap bond region 140, the adhesive covers the die bond pads 132 and portions of the wire bonds 164. This stabilizes the wire bonds and minimizes occurrence of wire sweep. Further, such configuration advantageously reduces the footprint of the package. Providing other configurations of die bond pads and wire bonds may also be useful.

Figure 3B:
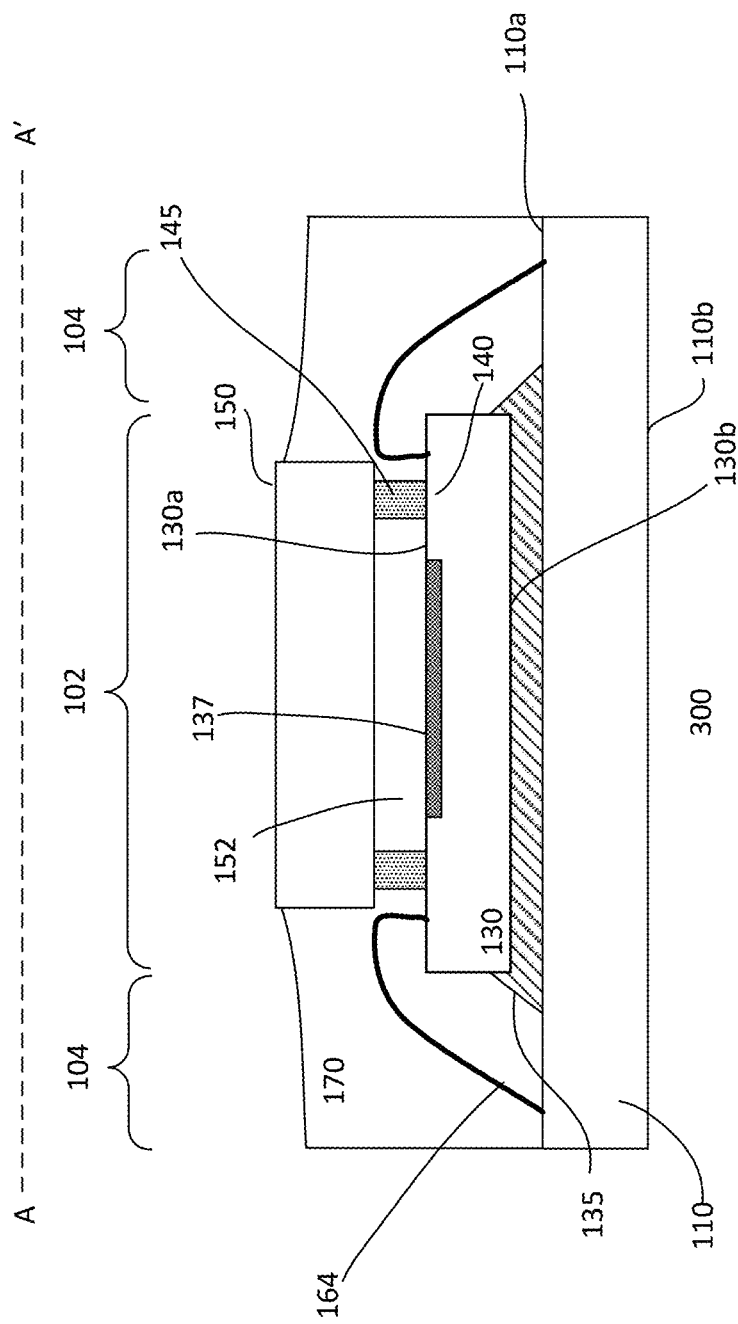
Figure 3C:
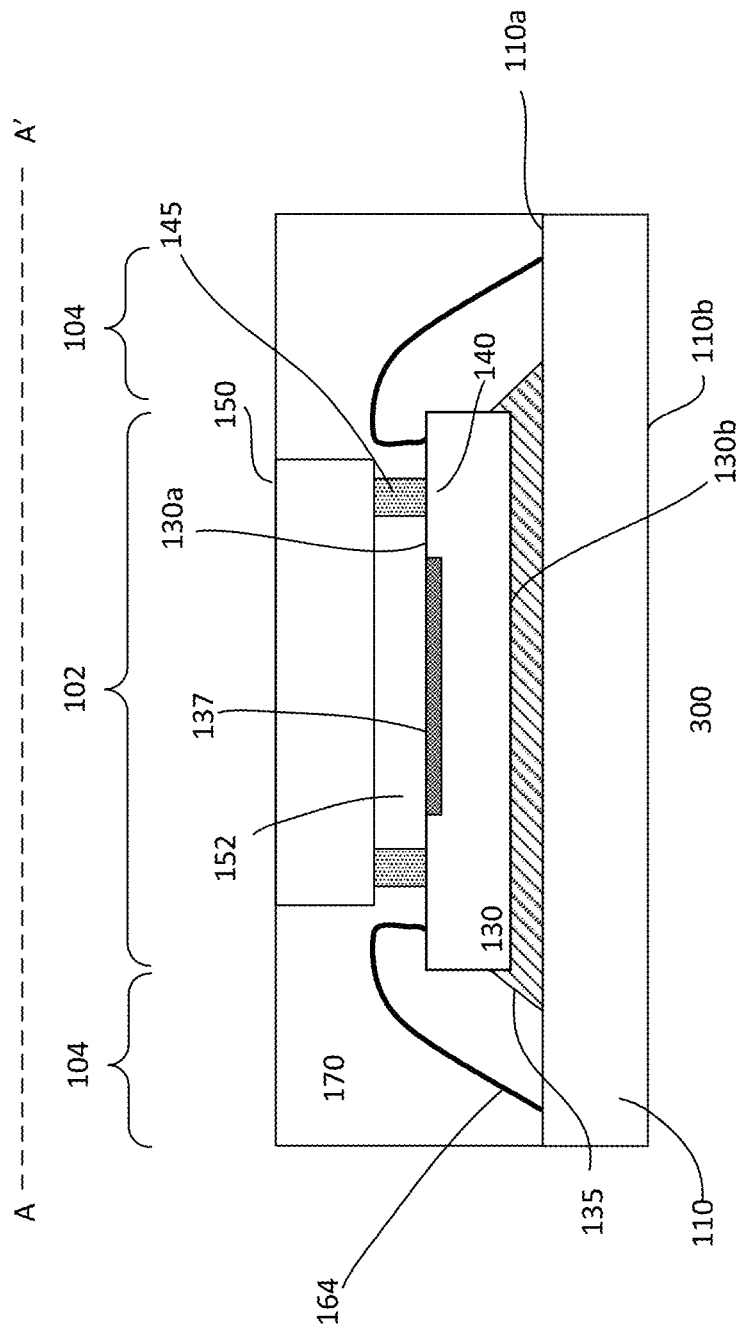

FIGS. 3a to 3c show top and side cross-sectional views of various embodiments of a semiconductor package 300. In particular, FIG. 3a shows a top cross-sectional view of a semiconductor package 300 with the package cover, and FIGS. 3b to 3c show side cross-sectional views taken along the A-A of the semiconductor package 300 formed with different encapsulants. The various embodiments include common elements. Common elements may not be described or described in detail.

The package 300 is similar to that described in FIGS. 1a to 1c. For example, die bond pads 132 are disposed outside of the cap bond region 140 of the active die surface 130a. As such, the wire bonds 164 are disposed outside of the protective cover 150. However, unlike FIGS. 1a to 1c, the standoff structure 145 does not include rigid studs. As shown, the standoff structure 145 is disposed on the cap bond region 140 on the active die surface surrounding the sensor region. For example, the standoff structure is a standoff ring which surrounds the sensor region.

In one embodiment, as discussed, the standoff structure is an adhesive-based standoff ring configured for attaching the protective cover over the sensor region. For example, the standoff ring includes an adhesive for attaching the protective cover to the die. The adhesive may be a curable adhesive. Any curable adhesive that has a high transparency and high refractive index may be used. The standoff structure, in one embodiment, is an adhesive-based standoff ring with spacers. The spacers, for example, are dispersed or distributed in the adhesive-based standoff ring. For example, the adhesive and spacers are disposed on the cap bond region at the same time. Alternatively, in another embodiment, the adhesive employed may include an adhesive premixed with spacers. Preferably spacers are formed of a transparent material. For example, the transparent material of the spacers may be conductive or non-conductive, such as an insulating material. For example, the spacer material may include glass. Alternatively, any transparent material that is able to support the standoff structure may also be possible. Providing an adhesive-based standoff ring with a non-uniform spacer distribution may also be useful.

The spacers serve to control an overall height uniformity of the standoff ring. For example, the protective cover 150 forms a planar protective cover over the standoff ring 145. A predetermined height of the standoff ring should be sufficient to ensure that the protective cover does not contact either the wire bonds or the sensor region during the packaging process. For example, a predetermined height of the standoff ring corresponds to the cavity height. For example, more spacers may be added in the adhesive mixture for a higher predetermined height. The spacers improve the rigidity of the adhesive-based standoff ring so that it is able to provide better support and prevent the protective cover from contacting and damaging the sensor region. Providing other configurations for the standoff structure other than a standoff ring may also be useful.

Figure 4A:
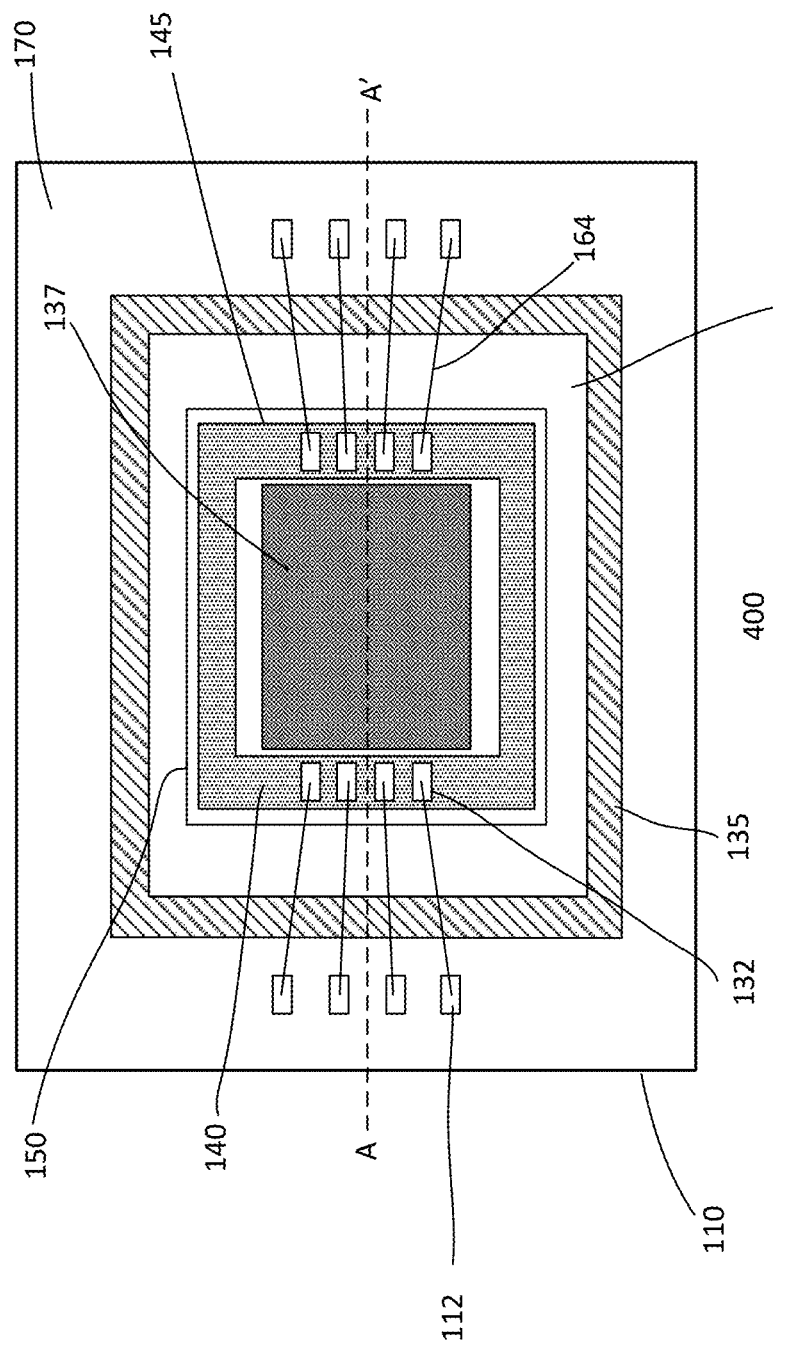
FIGS. 4a to 4c show top and side cross-sectional views of various embodiments of another semiconductor package.
Figure 4B:
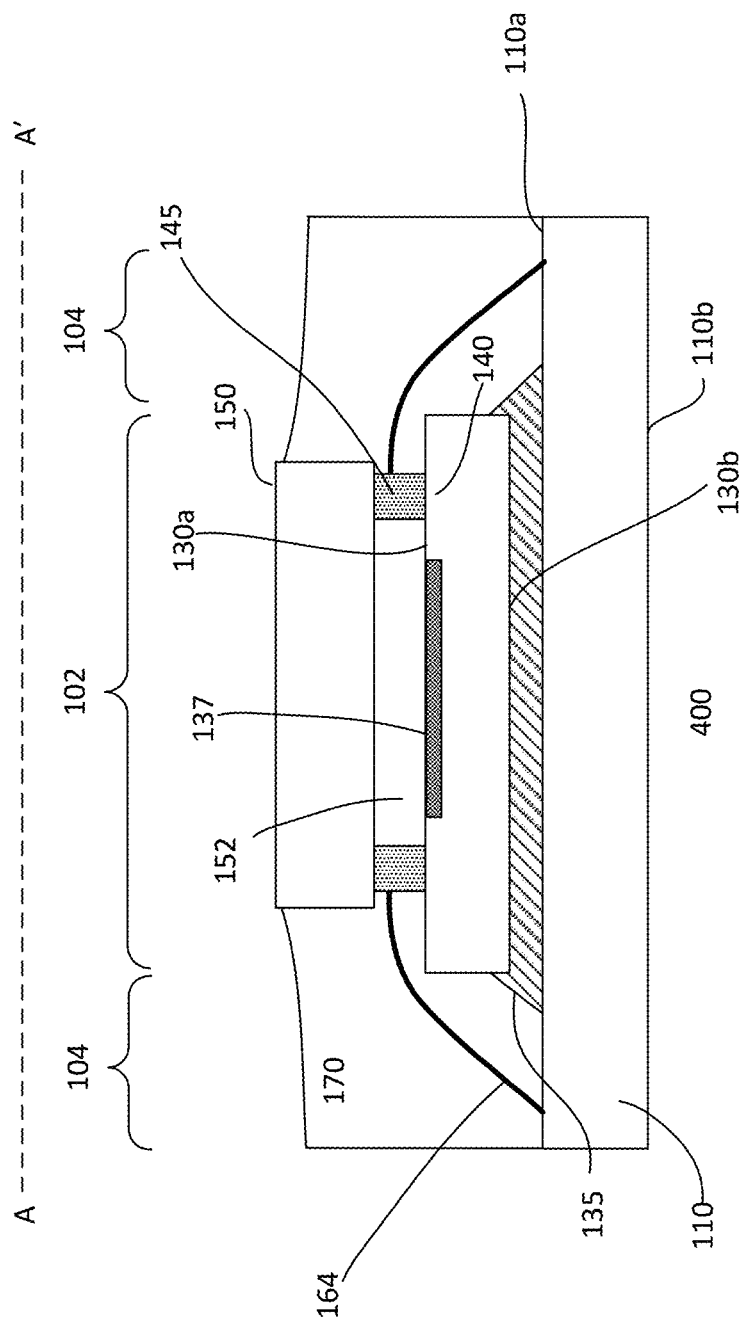
Figure 4C:
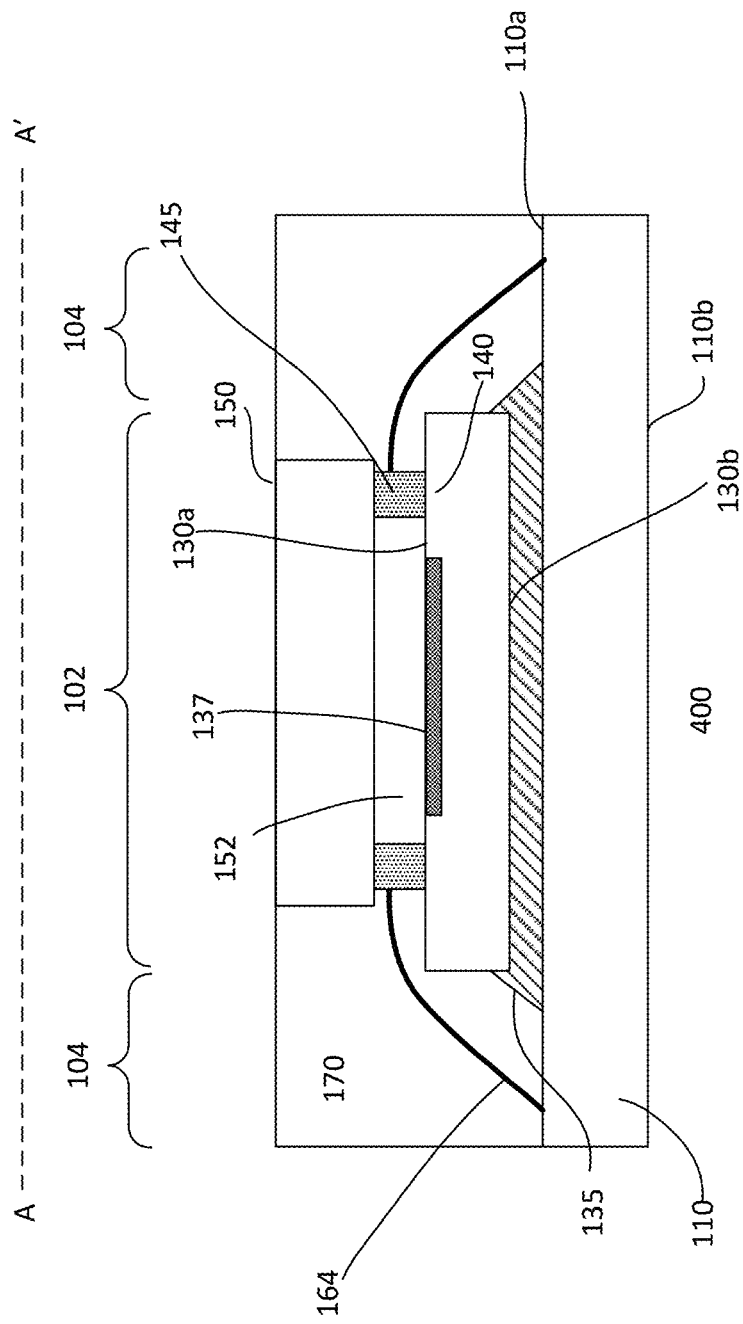

FIGS. 4a to 4c show top and side cross-sectional views of various embodiments of a semiconductor package 400. In particular, FIG. 4a shows a top cross-sectional view of a semiconductor package 400 with the package cover, and FIGS. 4b to 4c show side cross-sectional views taken along the A-A of the semiconductor package 400 formed with different encapsulants. The various embodiments include common elements. Common elements may not be described or described in detail.

The package 400 is similar to that described in FIGS. 3a to 3c. However, unlike FIGS. 3a to 3c, the die bond pads 132 are disposed on the cap bond region 140. As shown in FIG. 4a, they are arranged into one or more rows on the cap bond region.

In this case, the adhesive-based standoff ring disposed on the cap bond region includes spacers that are non-uniformly distributed. For example, the spacers are disposed between the die bond pads. For example, there are no spacers disposed on the die bond pads. The spacers may be disposed on the cap bond region at the same time as the adhesive is applied on the cap bond region, except that no spacers are disposed on the die bond pads. This avoids any spacers from contacting and damaging the wire bonds formed on the die bond pads disposed on the cap bond region. Alternatively, such configuration may be formed in a 2-step process. For example, an adhesive premixed with spacers is first dispensed to form a discontinuous ring structure. The gaps in the discontinuous ring structure correspond to positions of the die bond pads on the cap bond region. Another adhesive without spacers is then disposed thereover to fill up the gaps and form a continuous ring structure. For example, the adhesive without spacers covers the die bond pads 132 and portions of the wire bonds 164.

Providing other configurations of the standoff structure, such as an adhesive-based standoff ring without spacers may also be useful. For example, the adhesive employed to form the standoff ring does not include spacers. The adhesive applied to the cap bond region 140 covers the die bond pads 132 and portions of the wire bonds 164. Other configurations of die bond pads and wire bonds may also be possible.

Figure 5B:
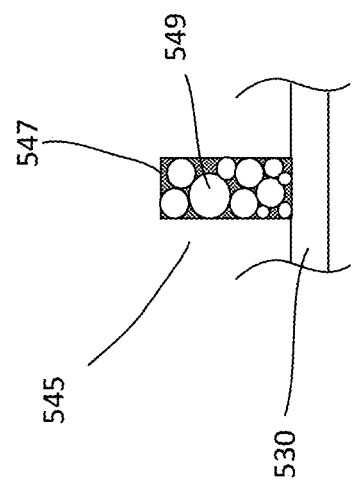
FIGS. 5a to 5b show cross-sectional views of various embodiments of a standoff structure formed on a semiconductor package.
Figure 5A:
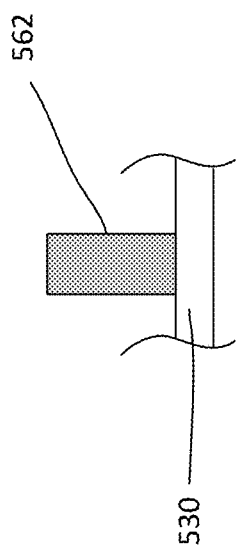

FIGS. 5a to 5b show cross-sectional views of portions of various embodiments of a standoff structure formed on the die 530. Referring to FIG. 5a, a standoff structure, in one embodiment, may include rigid studs. For example, the rigid studs are formed on dummy bond pads disposed on the cap bond region on the active die surface. Although FIG. 5a exemplarily shows a rigid stud 562 shaped in a rectangular form, forming the rigid studs in other shapes may also be useful. For example, forming the rigid studs as circular or spherical studs.

A rigid stud 562 can have a predetermined stud height of about 100 to 120 microns and a diameter (or width) which is preferably smaller than that of the cap bond region 140. The predetermined stud height may be dependent on die configuration, for example, dimensions of an active die area. The predetermined stud height may also be determined based on a wire loop height of the wire bonds formed on the die. For example, for a die with a low wire loop design (low wire loop height), the predetermined stud height is about 80 to 100 microns. The stud height should be sufficient to maintain a cavity height between the die and the protective cover. Providing rigid studs having other dimensions may also be useful. The height of all the rigid studs should be the same to prevent gaps between the top surface of the standoff structure and the protective cover. For example, the protective cover forms a planar protective cover over the standoff structure. The rigid studs, in one embodiment, are metallic studs. For example, the rigid stud may be formed using conductive materials such as Cu, Au, Ag, solder material, alloys or a combination thereof. Preferably, the material used to form the rigid studs may be the same as the material of the die bond pads. Providing other configurations or rigid materials for the rigid studs may also be useful.

In one embodiment, the rigid studs are formed at the single die level. For example, the rigid studs may be formed by bumping. The bumping may be part of the wire bonding process. For example, a first bumping step of the wire bonding process is performed on the dummy bond pads to form conductive ball or stud bonds on the dummy bond pads. Unlike die bond pads, no wire bonds or loops are formed after bumping. The conductive bump or stud bonds on the dummy bond pads serve as rigid studs of the standoff structure. Performing bumping as a process which is independent of the wire bonding process may also be possible. Other techniques, such as metal deposition techniques including sputtering, plating or evaporation, may also be useful for forming the rigid studs. Alternatively, rigid studs may be formed at the wafer level. For example, a soldering process may be employed to form the rigid studs. The rigid studs are formed on the dies in a wafer before the individual dies are singulated. Providing other techniques for forming the rigid studs either at the wafer or die level may also be useful.

In one embodiment, the standoff structure includes spacers. For example, the standoff structure is an adhesive-based standoff ring with spacers. The spacers, for example, are dispersed or distributed in the adhesive-based standoff ring. For example, an adhesive premixed with spacers is employed. The adhesive may be a curable adhesive. For example, the curable adhesive may include epoxy, acrylic, polyimide, urethane, thiol, or a combination thereof. Other suitable adhesive materials may also be useful, depending on the desired refractive index of the protective cover. Preferably, transparent spacers are employed. For example, the transparent material of the spacers may be conductive or non-conductive, such as an insulating material. For example, the spacer material may include glass. Alternatively, any transparent material that is able to support the standoff structure may also be possible.

Referring to FIG. 5b which shows a portion of the standoff ring, the standoff ring 545 includes a curable adhesive mixture 547 with circular-shaped spacers 549. Providing spacers in other shapes, such as spherical, ellipsoidal, cylindrical shapes, may also be useful. Furthermore, it is not necessary that the spacers all have the same shape. Providing other configurations for the standoff structure may also be possible.

In one embodiment, the spacers may define a predetermined height of the standoff ring 545. For example, the predetermined height of the standoff ring may depend on the amount and dimensions of the spacers. The predetermined height should be sufficient to maintain a cavity height between the die and the protective cover. Providing other predetermined heights for the standoff ring may also be useful. As shown in FIG. 5b, the spacers 549 in the standoff ring may be a mixture of spacers with different sizes. The size of the spacer is limited to a thickness or predetermined height of the standoff structure. For example, the spacers may have sizes equal to or smaller than the predetermined height of the standoff structure. Alternatively, providing spacers having the same dimension may also be useful.

Figure 6A:
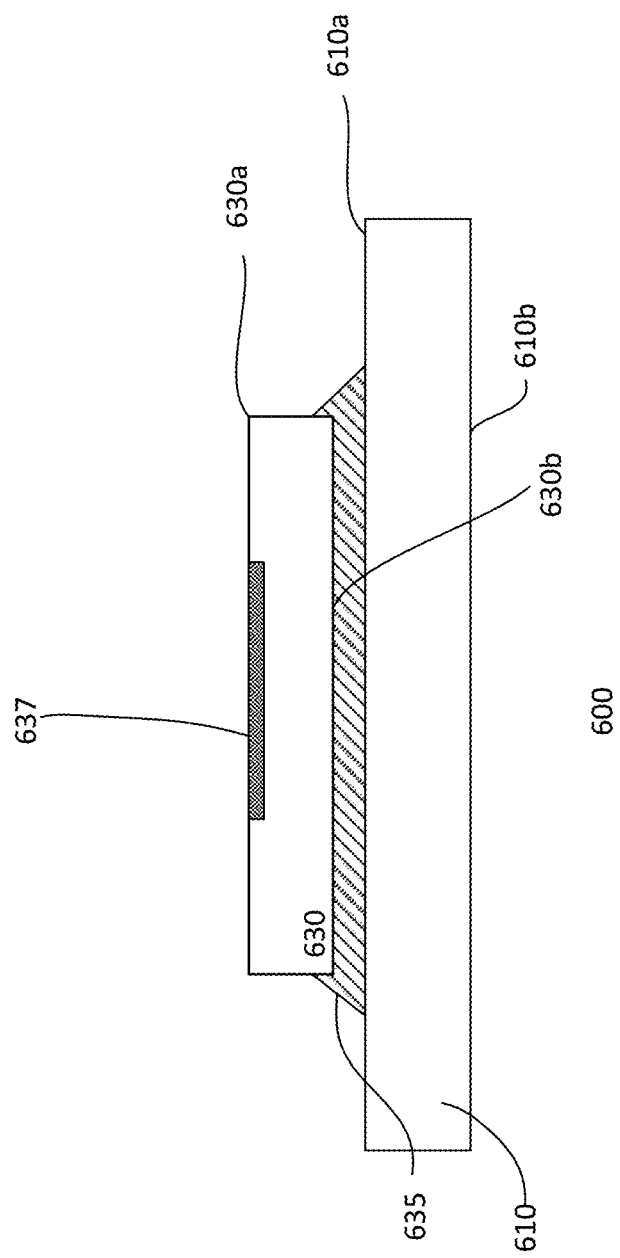
FIGS. 6a to 6$e_{ii}$ show an exemplary process of forming an embodiment of a semiconductor package.

FIGS. 6a to 6$e_{ii}$ show an exemplary process 600 of forming an embodiment of a semiconductor package. The package, for example, is similar to those described in FIGS. 1a to 1c, FIGS. 2a to 2c, and FIG. 5a. Common elements may not be described or described in detail.

Referring to FIG. 6a, a package substrate 610 is provided. The package substrate may include top and bottom package surfaces. The top package surface 610a of the package substrate may include a die attach region and package bond pads disposed outside of the die attach region. The bottom package surface 610b of the package substrate may include package contacts which are interconnected to the package bond pads on the opposing surface, for example, by one or more metal layers and via contacts embedded in the package substrate.

A die 630 is attached to the die attach region, for example, by a die adhesive 635. The die adhesive may be an adhesive tape disposed on the die attach region. The die, for example, is temporarily attached to the die attach region. For example, a curing process may be performed to permanently attach the die to the die region. The bottom surface or inactive surface 630b of the die, for example, contacts the die attach region. In one embodiment, the active die surface 630a includes a sensor region 637. Depending on the application of the die, the sensor region may include a sensor or an array of sensors. The top or active die surface may include die bond pads (not shown) including dummy bond pads disposed outside of the sensor region. For example, the die bond pads may be disposed on the non-sensor region of the active surface of the die.

Figure 6B:
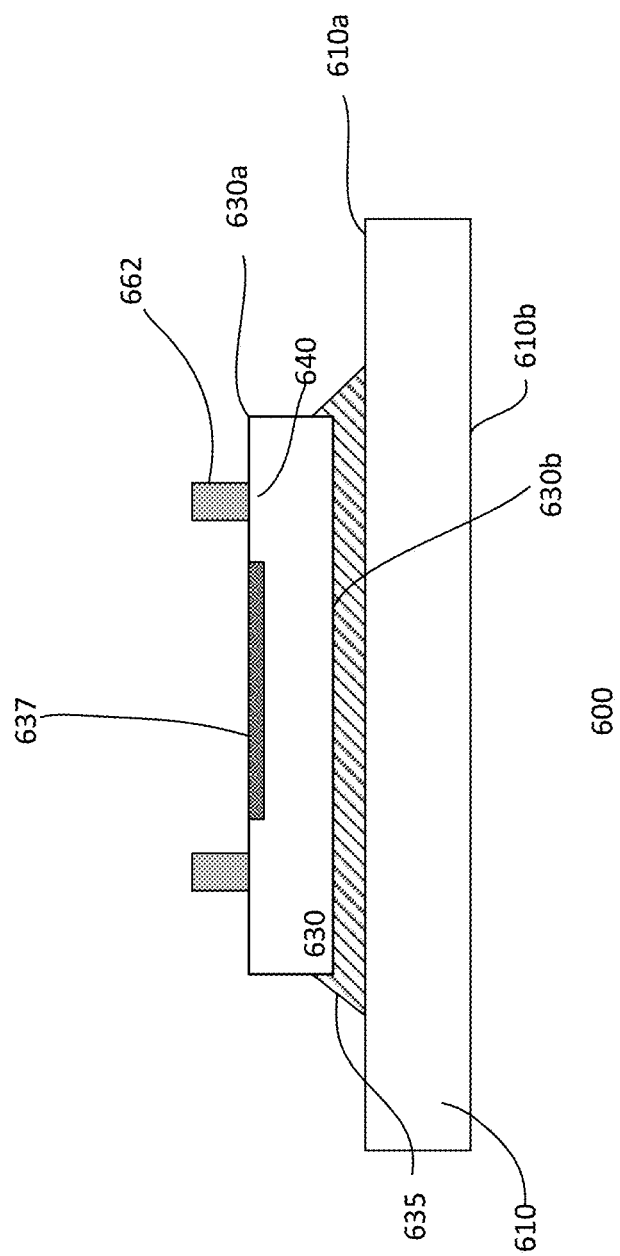

In FIG. 6b, rigid studs 662 are formed on a cap bond region 640 surrounding the sensor region 637 of the die. For example, the rigid studs are formed on dummy bond pads disposed on the cap bond region. In one embodiment, the rigid studs are formed as part of a standoff structure. For example, the rigid studs maintain an overall height uniformity of the standoff structure. As a result, when a protective cover is later on disposed on the standoff structure and over the sensor region, the standoff structure is able to support and maintain a height of a cavity formed between the die and the protective cover. Although FIG. 6b exemplarily shows rigid studs as rectangular-shaped studs, providing other shapes of rigid studs may also be useful. For example, employing circular or spherical shapes for the rigid studs.

In one embodiment, the rigid studs may be formed using conductive materials such as Cu, Au, Ag, solder material, alloys or a combination thereof. Other rigid materials for the rigid studs may also be useful. The rigid studs may be formed by, for example, bumping. The bumping process is similar to a wire bonding process except that no wire bond (or loop) is formed. For example, the bumping process forms a conductive ball bond on the dummy bond pad which serves as a rigid stud. In one embodiment, the bumping process may be performed as part of the wire bonding process. For example, a first part of the wire bonding process which is the bumping step, may be performed on both dummy bond pads and die bond pads. Performing a bumping process independent of the wire bonding process may also be possible. For example, rigid studs formed by bumping is separately performed on the dummy bond pads before wire bonding process begins for the die bond pads.

Other techniques such as metal deposition techniques, including sputtering, plating or evaporation, may also be useful for forming the rigid studs. In one embodiment, the rigid stud may be pre-formed at the wafer level before die singulation. For example, the die provided at FIG. 6a is already pre-formed with the rigid studs before it is attached to the die attach region of the package substrate. Soldering techniques may be employed to form the rigid studs on the dies in a wafer before the individual dies are singulated. In this case, first bumping step of the wire bonding process begins only for the die bond pads and not the dummy bond pads.

Figure 6C:
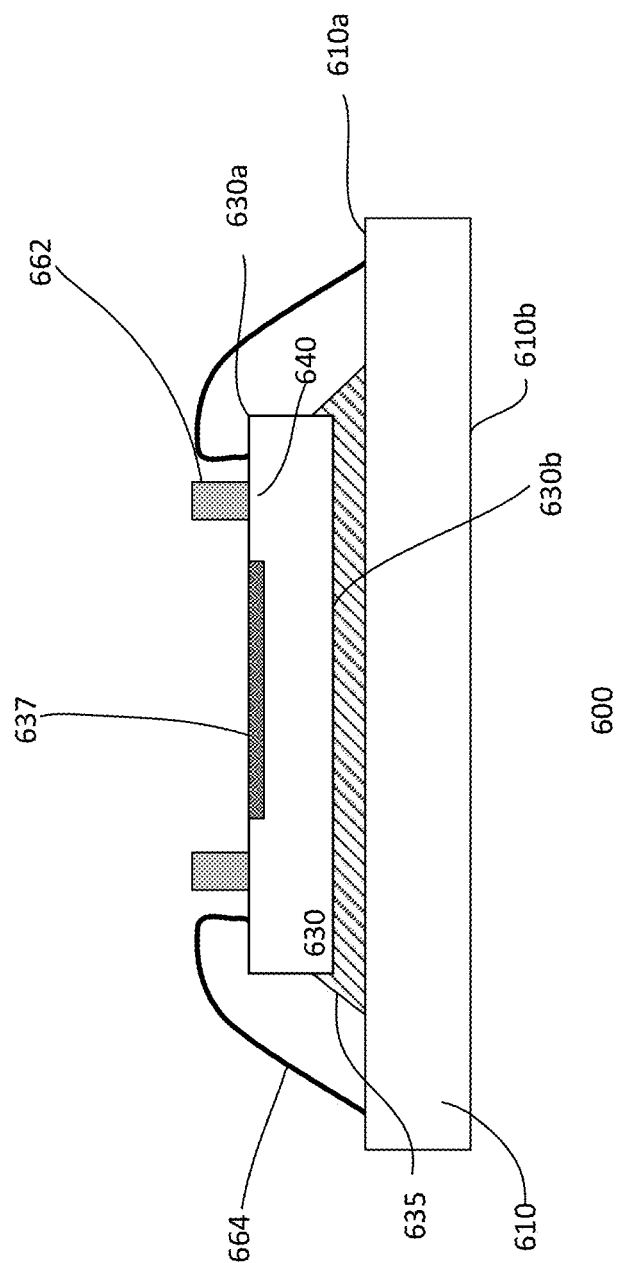

In FIG. 6c, wire bonds are completed between the die and package bond pads. As shown, the wire bonds 664 are formed outside of the cap bond region with the rigid studs 662. For example, the die bond pads are disposed outside of the cap bond region. Providing other arrangements for the die bond pads and the wire bonds may also be possible.

Figure 6D:
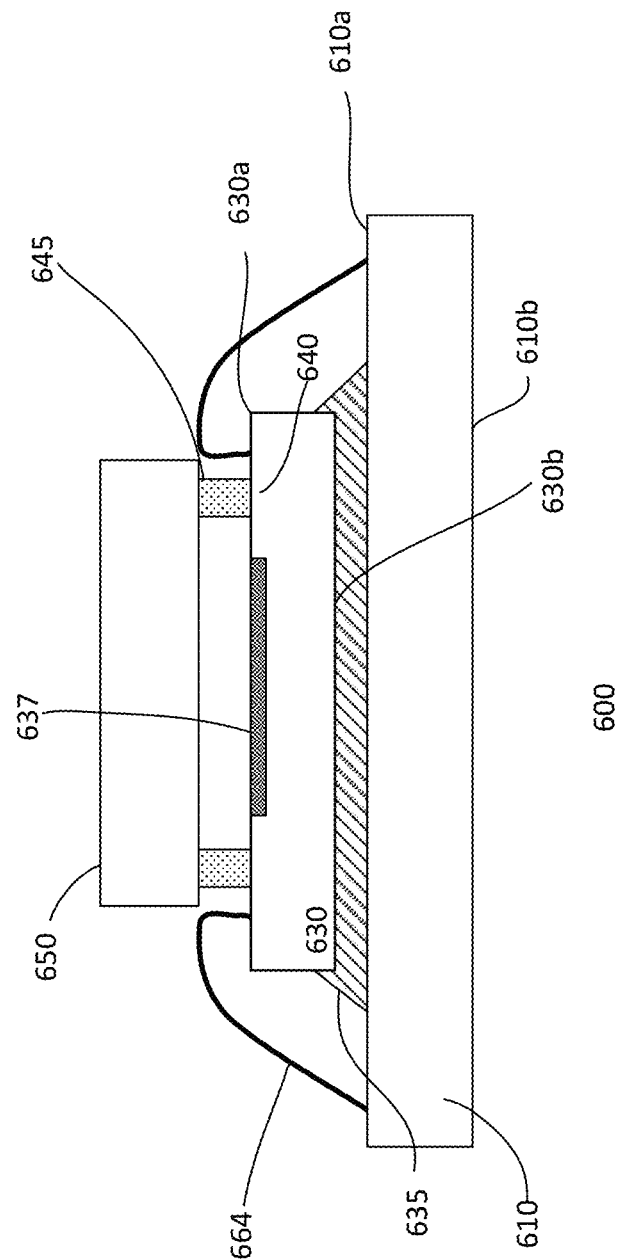

A protective cover 650 is attached to the die 630 in FIG. 6d. In one embodiment, the protective cover is diced from a cover substrate on which a plurality of protective covers are formed. The protective cover, for example, is a glass cover. Other types of protective cover may also be useful.

An adhesive configured for attaching the protective cover over the sensor region is disposed on the cap bond region. As shown, the adhesive covers the rigid studs and forms a standoff ring 645 which completely surrounds the sensor region. For example, the standoff ring 645 including the rigid studs serve as the standoff structure for maintaining a cavity height between the die and the protective cover. Providing other configurations for the standoff structure may also be possible. The adhesive, for example, may be a UV-curable adhesive. Employing other types of adhesives may also be useful. The adhesive may be applied by dispensing. Other techniques for applying the adhesive may also be useful.

In one embodiment, as shown, the die bond pads and their wire bonds 664 are disposed outside of the protective cover 650. In cases where the die bond pads are disposed on the cap bond region, the adhesive covers the die bond pads and portions of the wire bonds. For example, referring back to FIGS. 2a to 2c, portions of the wire bonds are covered by the protective cover. A curing process, like UV curing and thermal curing, may then be employed to permanently attach the cover to the die.

In FIGS. $6e_i$ and $6e_{ii}$, an encapsulant 670 is formed over the package substrate. The encapsulant covers the package substrate, exposed portions of the die and wire bonds, and sides of the protective cover. The material for forming the encapsulant may include ceramic, plastic, epoxy, or a combination thereof. The encapsulant may be formed by, for example, dispensing. For example, the encapsulant is a liquid encapsulant. As shown in $6e_i$, the topmost surface of the encapsulant 670 may be formed slightly below the top surface of the protective cover and slopes downwardly from the protective cover towards a perimeter of the non-die region outside of the die attach region. Other techniques or materials may also be employed for the encapsulant. For example, transfer molding using a mold compound may also be possible. As shown, in FIG. $6e_{ii}$, the package is encapsulated in an epoxy mold compound with vertical sidewalls and a substantially planar top surface that is about level with the top surface of the protective cover. The encapsulant is cured thereafter.

FIGS. 7a to $7e_{ii}$ show an exemplary process 700 of forming another embodiment of a semiconductor package. Common elements may not be described or described in detail. The semiconductor package is, for example, same or similar to those described in FIGS. 3a to 3c, FIGS. 4a to 4c, and FIG. 5b. For example, the active surface 730a of the die does not include dummy bond pads.

Figure 7B:
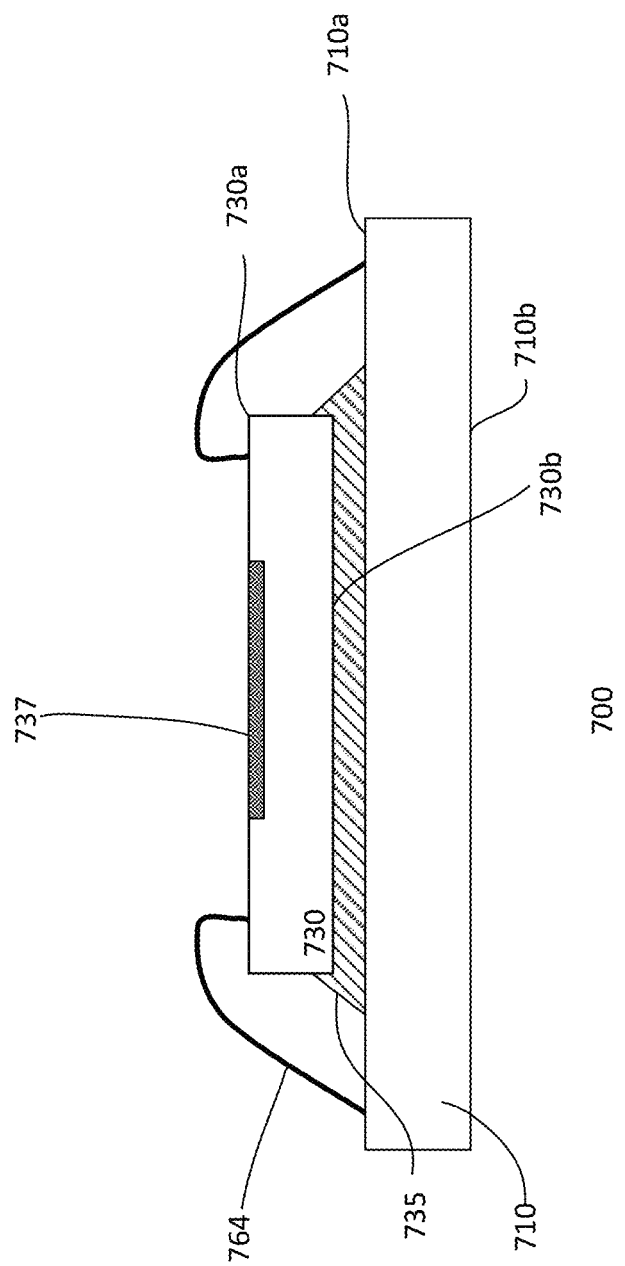
FIGS. 7a to 7$e_{ii}$ show an exemplary process of forming another embodiment of a semiconductor package.

Referring to FIG. 7a, it is at the stage of processing similar to that described in FIG. 6a. As shown, a die 730 is attached to the die attach region of the package substrate 710. Wire bonds 764 are then formed in FIG. 7b. For example, wire bonds between the die bond pads of the die and the package bond pads of the package substrate are formed. In this case, the die bond pads and the wire bonds 764 formed thereon are disposed outside of the cap bond region 740.

Figure 7C:
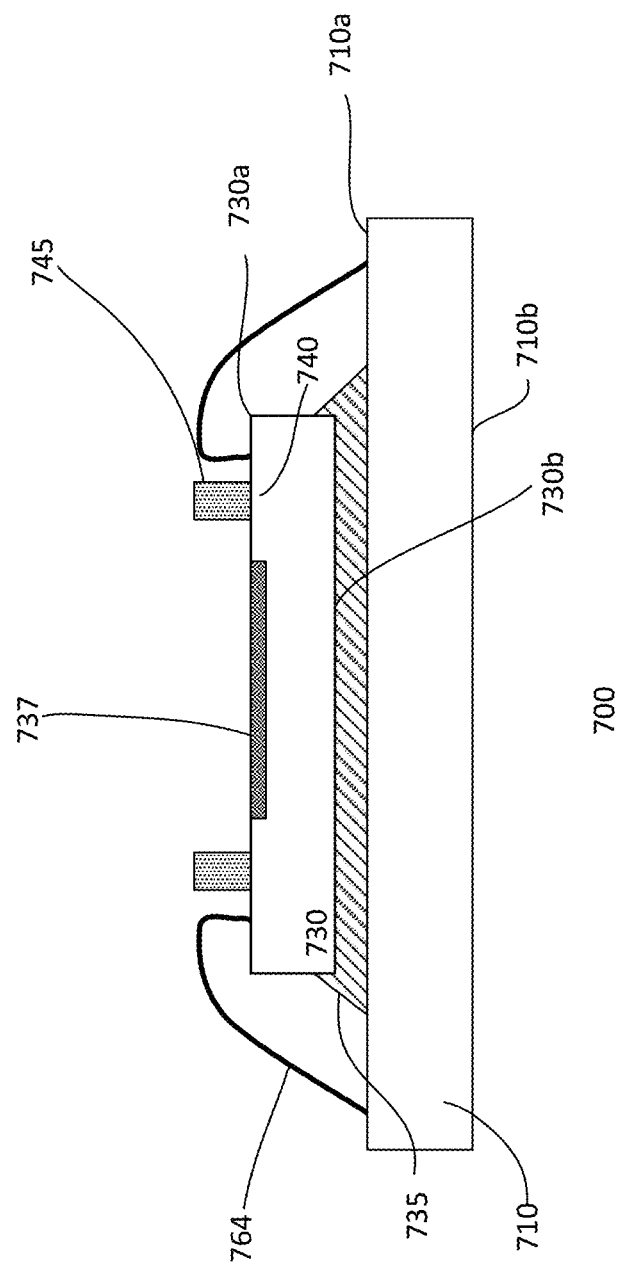

In FIG. 7c, a standoff structure is formed thereafter. For example, the standoff structure is formed as an adhesive-based standoff ring 745 on the cap bond region 740 and completely surrounds the sensor region. As shown, the standoff ring is disposed between the sensor region 737 and the wire bonds. In one embodiment, the standoff structure is an adhesive-based standoff ring with spacers. The spacers, for example, are dispersed or distributed in the adhesive-based standoff ring. The standoff structure may be formed by applying an adhesive on the cap bond region. The adhesive, for example, may be an adhesive premixed with spacers. For example, the adhesive includes a curable transparent adhesive with transparent spacers. Providing other materials for the adhesive and the spacers may also be possible.

In cases when the die bond pads and the wire bonds formed thereon are disposed on the cap bond region (not shown), the standoff structure may be an adhesive-based standoff ring with a non-uniform spacer distribution. For example, there are no spacers disposed on the die bond pads. When the adhesive and spacers are disposed at the same time on the cap bond region, no spacers are disposed on the cap bond region. This avoids any spacers from contacting and damaging the wire bonds formed on the die bond pads disposed on the cap bond region. Alternatively, such standoff ring may be formed in a 2-step process. For example, an adhesive with spacers is first dispensed on the cap bond region to form a discontinuous ring structure. The gaps in the discontinuous ring structure correspond to positions of the die bond pads on the cap bond region. Another adhesive without spacers is then disposed thereover to fill up the gaps and form a continuous ring structure. For example, the adhesive without spacers covers the die bond pads and portions of the wire bonds. Other configurations of the standoff ring may also be possible. For example, adhesive without spacers is employed to form the standoff ring on the cap bond region with die bond pads and wire bonds.

Figure 7D:
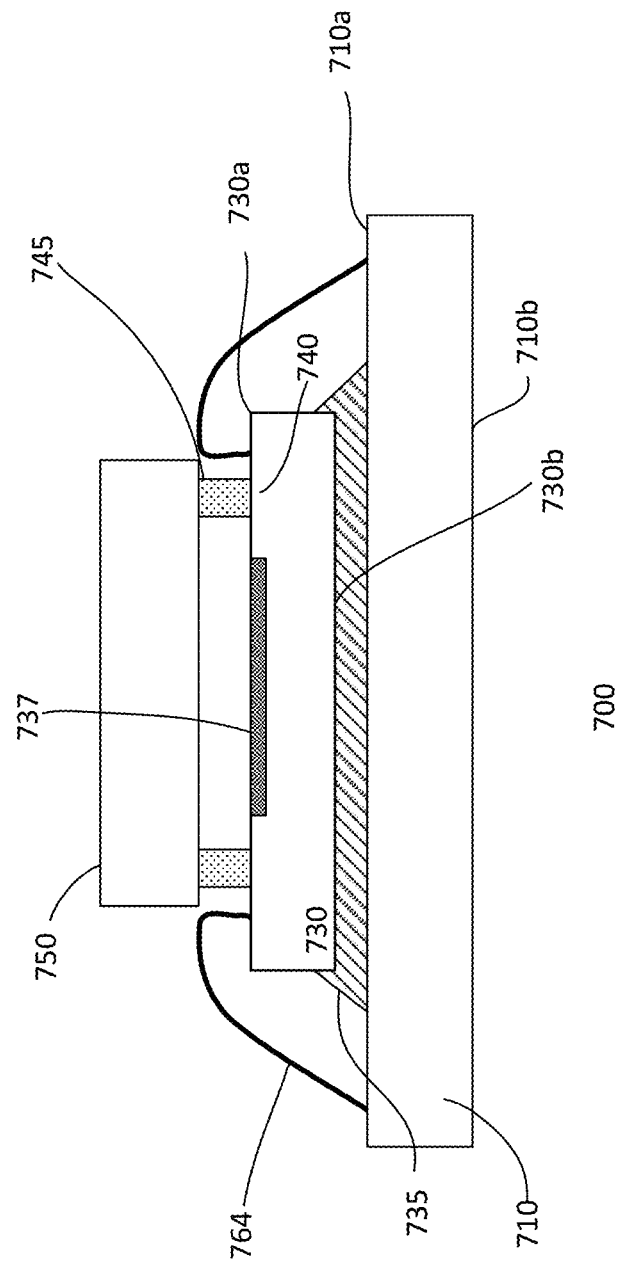

Similar to the process steps described in FIG. 6d, a protective cover 750 is attached to the die in FIG. 7d. For example, the adhesive-based standoff ring serves to attach the protective cover over the sensor region. In one embodiment, as shown in FIG. 7d, wire bonds 764 on the die bond pads are disposed outside of the protective cover 750. Providing other arrangements for the wire bonds and the die bond pads may also be possible. For example, in other embodiments like FIGS. 4a-4c, the die bond pads are disposed on the cap bond region and therefore portions of the wire bonds are covered by the protective cover.

The process completes by forming an encapsulant 770 over the package substrate in FIGS. $7e_i$ and $7e_{ii}$. The encapsulant may be a liquid encapsulant as shown in FIG. $7e_i$. Alternatively, in FIG. $7e_{ii}$, an epoxy mold compound may be used. Providing other materials or configurations for the encapsulant may also be useful.

Typically, the package substrate may include a leadframe with multiple package substrates. For example, the package substrates of the leadframe may be arranged in a matrix format, with rows and columns of package substrates. This facilitates parallel processing. For example, a plurality of dies are attached to the package substrates. After processing is completed, the leadframe is singulated, separating it into individual packages.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    a package substrate having top and bottom major package substrate surfaces, the top major package substrate surface includes a die attach region;
    a die having a second major die surface attached to the die attach region, the die comprises an image sensor die, wherein a first major die surface of the die includes a sensor region with an image sensor and a cap bond region surrounding the sensor region;
    a cap standoff structure on the cap bond region, wherein the cap standoff structure comprises
        a continuous cap adhesive ring disposed on the first major die surface of the die in the cap bond region surrounding the sensor region, and discontinuous rigid spacers distributed completely within the continuous cap adhesive ring, wherein the discontinuous rigid spacers each comprises a discontinuous metallic stud disposed on a dummy bond pad, the discontinuous rigid spacers are non-electrically functional rigid spacers;

active die bond pads disposed on the first major die surface in the cap bond region, the active bond pads include wire bonds coupled to package bond pads on the top major package substrate surface; and a transparent protective cover attached to the cap standoff structure by the continuous cap adhesive ring, the transparent protective cover forms a cavity over the sensor region, and wherein the discontinuous rigid spacers within the continuous cap adhesive ring maintains a height of the cavity (cavity height) between the transparent protective cover and the first major die surface at least at about a predefined height.

2. The device of claim 1, wherein the continuous cap adhesive ring surrounding the sensor region comprises a transparent cap adhesive ring.

3. The device of claim 1, wherein the first major die surface of the die further includes die bond pads disposed on the cap bond region.

4. The device of claim 2, wherein the discontinuous rigid spacers comprise transparent rigid spacers.

5. The device of claim 1, wherein the discontinuous rigid spacers comprise rigid studs.

6. The device of claim 1, wherein the predefined height ranges between about 100 to 120 microns.

7. The device of claim 5, wherein the rigid studs comprise bumped studs.

8. The device of claim 1, wherein the first major die surface of the die further includes die bond pads disposed on the cap bond region, wherein the die bond pads comprise wire bonds.

9. The device of claim 5, wherein the rigid studs comprise wafer level soldered studs.

10. The device of claim 5, wherein the rigid studs are metallic studs.

11. The device of claim 1, wherein the cavity includes an air cavity sealed by the continuous cap adhesive ring.

12. The device of claim 1, wherein the discontinuous rigid spacers comprise different cross-sectional dimensions.

13. The device of claim 4, wherein the first major die surface of the die further includes die bond pads disposed on the cap bond region, the die bond pads comprise wire bonds.

14. The device of claim 1, wherein the discontinuous rigid spacers are non-uniformly distributed in the continuous cap adhesive ring.

* * * * *